United States Patent

Sugimoto

Patent Number: 5,298,861
Date of Patent: Mar. 29, 1994

[54] MAGNETIC RESONANCE IMAGING APPARATUS

[75] Inventor: Hiroshi Sugimoto, Utsunomiya, Japan

[73] Assignee: Kabushiki Kaisha Toshiba, Kawasaki, Japan

[21] Appl. No.: 981,613

[22] Filed: Nov. 25, 1992

[30] Foreign Application Priority Data

Nov. 28, 1991 [JP] Japan ................................ 3-314549

[51] Int. Cl.$^5$ ............................................ G01R 33/20
[52] U.S. Cl. ............................................ 324/306
[58] Field of Search ................ 324/300, 306, 307, 309, 324/318, 322

[56] References Cited

U.S. PATENT DOCUMENTS

| | | | |
|---|---|---|---|
| 4,570,119 | 2/1986 | Wehrli et al. | 324/306 |
| 4,574,239 | 3/1986 | Singer | 324/306 |
| 4,602,641 | 7/1986 | Feinberg | 324/306 |
| 4,609,872 | 9/1986 | O'Donnell | 324/306 |
| 4,937,526 | 6/1990 | Ehman et al. | 324/309 |
| 4,991,586 | 2/1991 | Mueller et al. | 128/653 |
| 5,093,620 | 3/1992 | Pelc et al. | 324/306 |
| 5,115,812 | 5/1992 | Sano et al. | 324/306 |
| 5,170,122 | 12/1992 | Bernstein | 324/306 |
| 5,226,418 | 7/1993 | Bernstein | 324/306 |

Primary Examiner—Michael J. Tokar
Attorney, Agent, or Firm—Limbach & Limbach

[57] ABSTRACT

A magnetic resonance imaging method capable of discriminating the flow directions of fluids, such as bloodstreams, and suitable for MR angiography first selectively excites two side regions, which are located in the vicinity of a region to be imaged including fluids in an object to be examined, and which include first and second fluids flowing into the region to be imaged along different directions, by using RF pulses (90° pulses) different from each other in phase by 90°. A spin in one side region is rotated to the x'-axis direction in a rotating coordinate system, and that in the other side region is rotated to the y'-axis direction in the system. A 180° pulse is applied to the region to be imaged to invert the polarity of a spin, thereby generating MR signals. The acquired MR signals are subjected to quadrature detection, and MR images are reconstructed for both a real-part component and an imaginary-part component different from each other in phase by 90°. In each of the two images, only a fluid flowing in one direction appears. The flow directions of the fluids can be discriminated by comparing the two images.

15 Claims, 8 Drawing Sheets

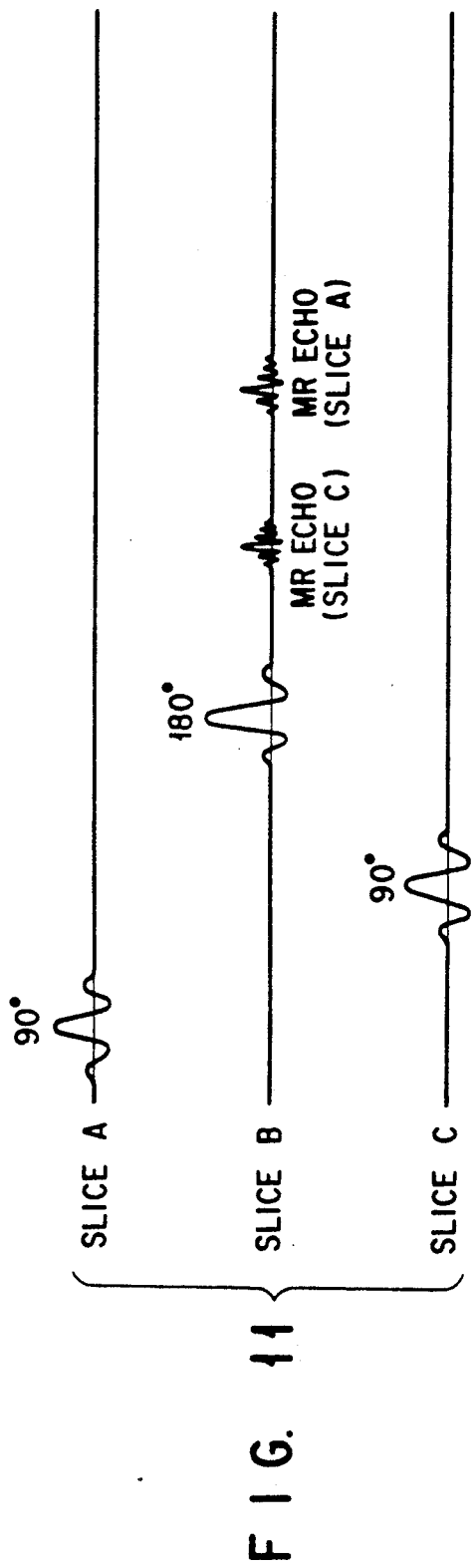
F I G. 11
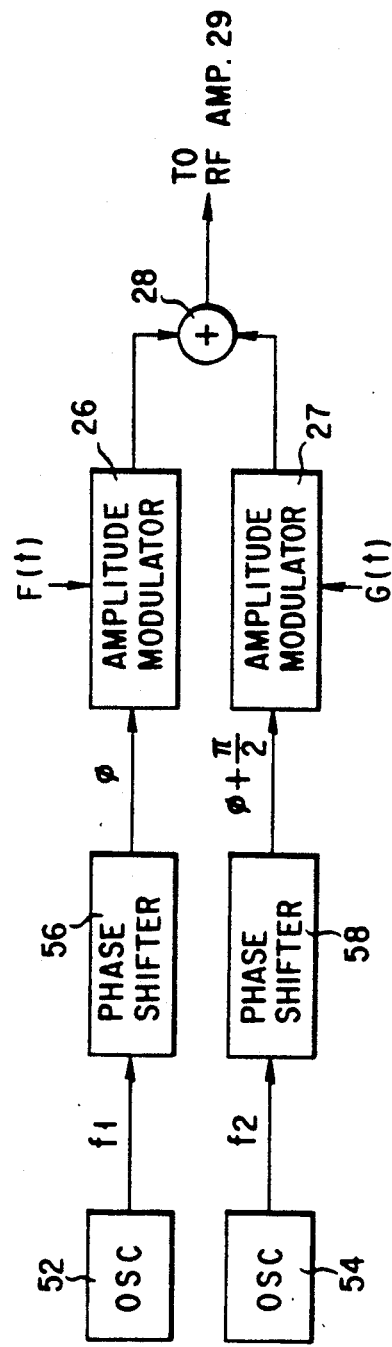
F I G. 12

MAGNETIC RESONANCE IMAGING APPARATUS

BACKGROUND OF THE INVENTION

1. Field of the Invention

The present invention relates to a magnetic resonance imaging (MRI) apparatus and MRI method and, more particularly, to a magnetic resonance imaging apparatus and MRI method capable of discriminating the flow directions of fluids, such as bloodstreams, and suitable for magnetic resonance (MR) angiography.

2. Description of the Related Art

Recently, MR angiography for imaging only a bloodstream portion without using any contrast medium has attracted attention as non-invasive angiography. As a method of discriminating the flow directions of fluids in this angiography, a pre-saturation method is known.

The principle of this pre-saturation method will be described with reference to FIGS. 1A to 1C. Consider the case wherein, as shown in FIG. 1A, two blood vessels BD1 and BD2 extend through three parallel slices A, B, and C substantially perpendicularly to these slices.

First, as shown in FIG. 1B, a nucleus spin in the slice A is excited sufficiently to saturation beforehand by a 90° pulse. Consequently, the direction of the nuclear spin in the slice A is rotated 90° from the z'-axis to x'-axis direction in a rotating coordinate system. Thereafter, as shown in FIG. 1C, the slice B is similarly excited by the 90° pulse, and an MR signal from the slice B is acquired. Since a bloodstream flowing into the slice B through the blood vessel BD1 is already saturated in the slice A, the signal value of the blood vessel BD1 is so small that the signal forms a blank image in black in an MR image of the slice B. On the contrary, a bloodstream flowing into the slice B through the blood vessel BD2 in a direction opposite to that of the blood vessel BD1 appears in the MR image of the slice B.

Subsequently, although not shown, a nucleus spin in the slice C is excited sufficiently to saturation by the 90° pulse in the same manner as described above. Thereafter, the slice B is similarly excited by the 90° pulse, and an MR signal from the slice B is acquired. Since, in this case, the bloodstream flowing into the slice B through the blood vessel BD2 is already saturated in the slice C, the signal value of the acquired MR signal is small, so that the signal of the blood vessel BD2 forms a black blank image in the MR image of the slice B. However, the bloodstream flowing into the slice B through the blood vessel BD1 appears in the MR image of the slice B.

Hence, the flow directions of the blood vessels BD1 and BD2 can be discriminated by checking which of the slices A and C adjacent to the signal acquisition slice B is pre-saturated when the blank image is formed. Note that the excitation pulse for the slice B is not limited to a 90° pulse but may be a 180° pulse.

To discriminate bloodstream flow directions by the above pre-saturation method, however, it is necessary to perform the signal acquisition and image reconstruction twice in the two directions. This results in a long imaging time and a reduction in throughput of patients. In addition, when the imaging time is prolonged, there is a high possibility that a patient to be examined or a portion to be examined moves, thus interfering acquisition of a correct diagnostic image.

SUMMARY OF THE INVENTION

Accordingly, it is an object of the present invention to provide a magnetic resonance imaging apparatus and method capable of discriminating the flow directions of bloodstreams or the like easily and shortening an imaging time and useful in carrying out magnetic resonance angiography.

A magnetic resonance imaging apparatus according to the present invention comprises selective exciting means for selectively exciting at least two side regions, which are located in the vicinity of a region to be imaged including fluids in an object to be examined, and which also include the fluids, with two different phases in a rotating coordinate system by using a radio-frequency (RF) pulse, signal acquiring means for acquiring magnetic resonance (MR) signals from the region to be imaged after the selective excitation performed by the selective exciting means, and phase detecting means for detecting phases of the acquired MR signals for each of the two phases.

A magnetic resonance imaging method according to the present invention comprises the steps of selectively exciting a nuclear spin in a first region through which a fluid flows, inverting a polarity of a nuclear spin in a second region through which the fluid having passed through the first region flows, thereby generating an MR signal, acquiring the generated MR signal, and reconstructing an MR image from the acquired MR signal.

According to the magnetic resonance imaging apparatus of the present invention, fluids flowing from the two side regions into the region to be imaged are excited by different phases. Therefore, by imaging the respective detection results obtained for the two phases, the flow directions of the fluids can be discriminated by using the two MR images.

According to the magnetic resonance imaging method of the present invention, a fluid flow of only a predetermined direction can be imaged.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 11 shows a main part (of only RF pulses) of a pulse sequence of the third modification; and FIG. 12 is a block diagram showing a modification of a selective excitation means.

DETAILED DESCRIPTION OF THE PREFERRED EMBODIMENTS

Figure 1A:
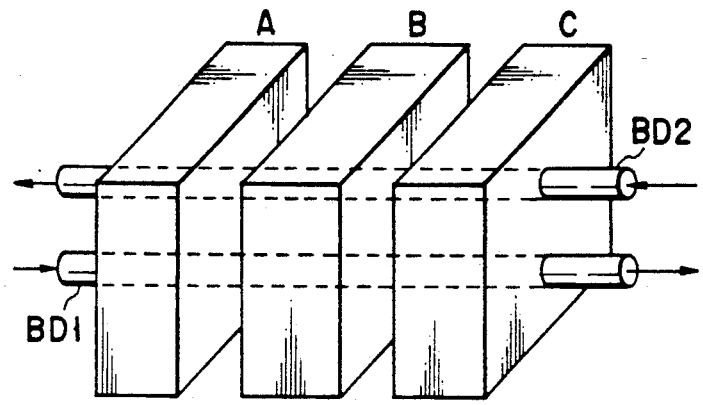
FIGS. 1A, 1B and 1C are views for explaining the principle of a conventional technique for discriminating bloodstream flow directions according to the presaturation method.
Figure 1B:
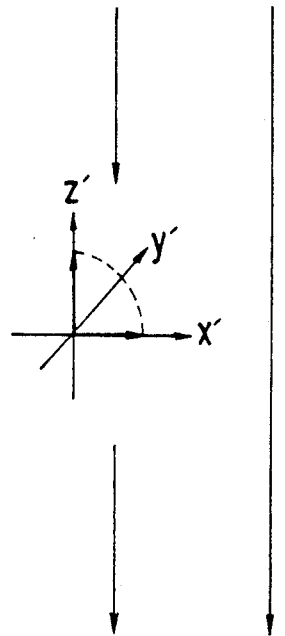
Figure 1C:
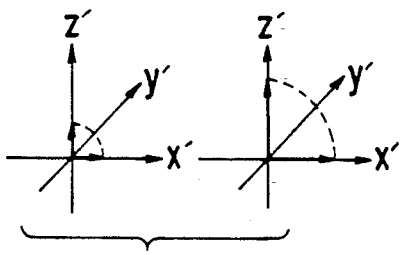
Figure 2:
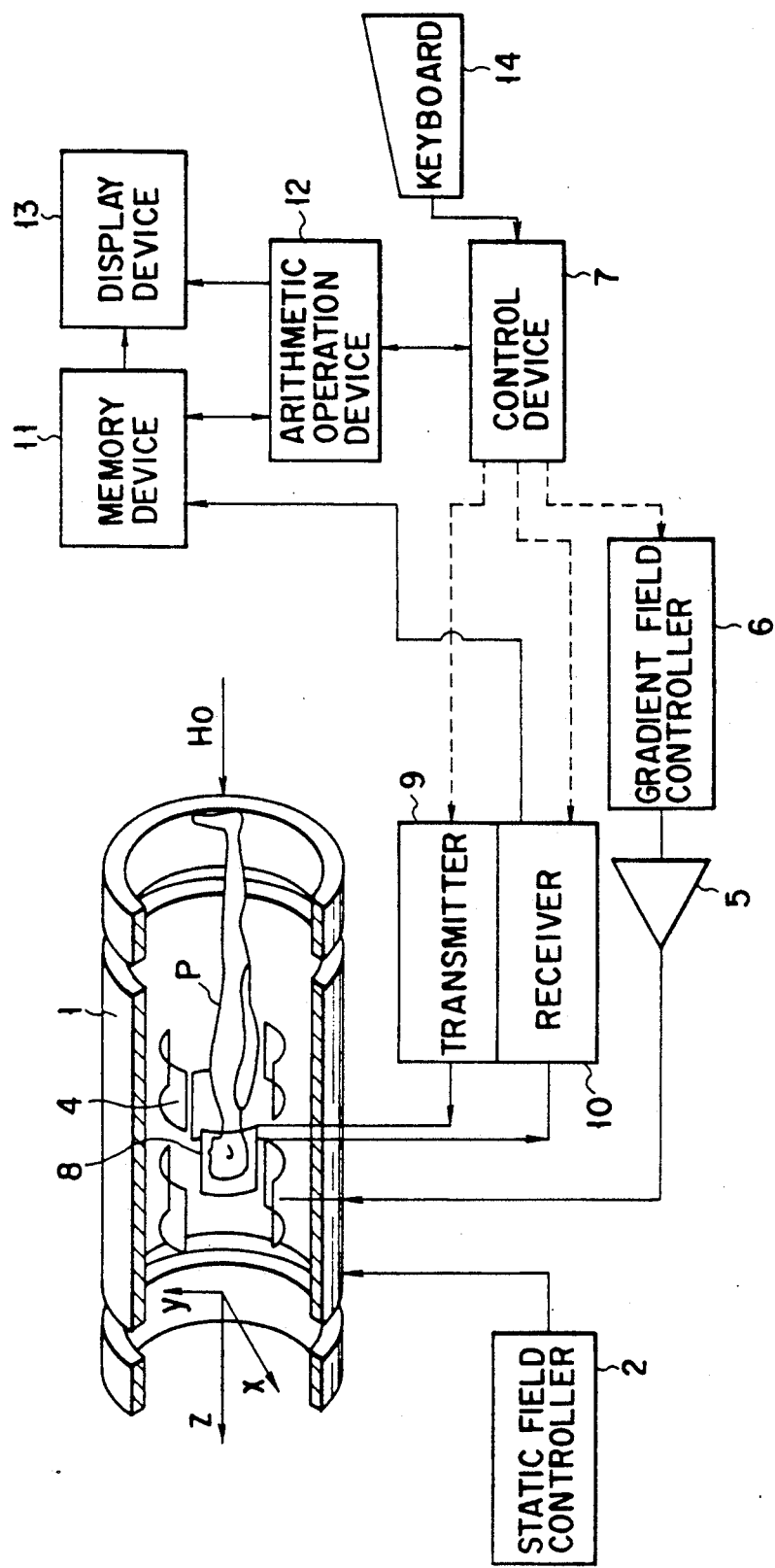
FIG. 2 is a block diagram showing a first embodiment of a magnetic resonance imaging apparatus according to the invention.

A preferred embodiment of a magnetic resonance imaging apparatus according to the present invention will now be described with reference to the accompanying drawings. FIG. 2 is a block diagram showing a schematic arrangement of the first embodiment.

Generally speaking, this magnetic resonance imaging apparatus comprises a magnet section for generating a static field, a gradient field section for generating a gradient field for giving position information to the static field, a transmitter/receiver section for spin excitation and MR signal reception, and a control/arithmetic section for system control and data processing.

More specifically, the magnet section includes a magnet 1 of, e.g., a superconducting type, having a cylindrical shape with an opening portion through which a patient (as an object to be examined) P is inserted, and a static field controller 2 for supplying a current to the magnet 1. The magnet section generates a static field $H_0$ in the z-axis direction as the body-axis direction of the patient.

The gradient field section includes three gradient field coils 4 (only a part of them is shown) for the x, y, and z axes, incorporated in the magnet 1, and a gradient field power supply for supplying a current to the gradient field coils 4. The gradient field power supply is formed of a gradient field amplifier 5 and a gradient field controller 6. The gradient field controller 6 supplies a drive signal to the gradient field amplifier 5 in accordance with a pulse sequence generated by a main control device 7. As a result, a gradient field in which a linear field is superposed on the static field $H_0$ is formed, and position information for imaging is given to an excited spin.

The transmitter/receiver section includes a radio-frequency (RF) coil 8 arranged in the vicinity of the patient P in the magnet 1 to perform both transmission and reception, and a transmitter 9 and a receiver 10 both connected to the RF coil 8. The transmitter 9 causes the RF coil 8 to generate an RF pulse for causing magnetic resonance on the basis of a command from the control device 7. The receiver 10 performs processing, such as detection and amplification, for an MR signal acquired by the RF coil 8 and sends the processing result signal to a memory device 11.

The control/arithmetic section includes the main control device 7 connected to the transmitter 9, the receiver 10, and the gradient field controller 6, the memory device 11 for storing processed data, an arithmetic operation device 12 for reconstructing an MR image, and a display device 13 for displaying the image. The control device 7 is also connected to an input device, such as a keyboard 14. The arithmetic operation device 12 performs a large volume of arithmetic operations including Fourier transformation for an MR signal stored in the memory device 11 and thereby generates MR image data. This image data is displayed on the display device 13.

The internal memory of the control device 7 stores a procedure (pulse sequence) capable of controlling from a predetermined scan planning to image scanning, as one of fixed data. Upon activation of the system, this procedure data is transferred to a working area of the internal memory. While imaging is performed in accordance with the called procedure, messages are displayed on the display device 13. This allows an operator to make necessary interaction with the system by using the keyboard, and the predetermined procedure is completed on the basis of the interaction results.

Figure 3:
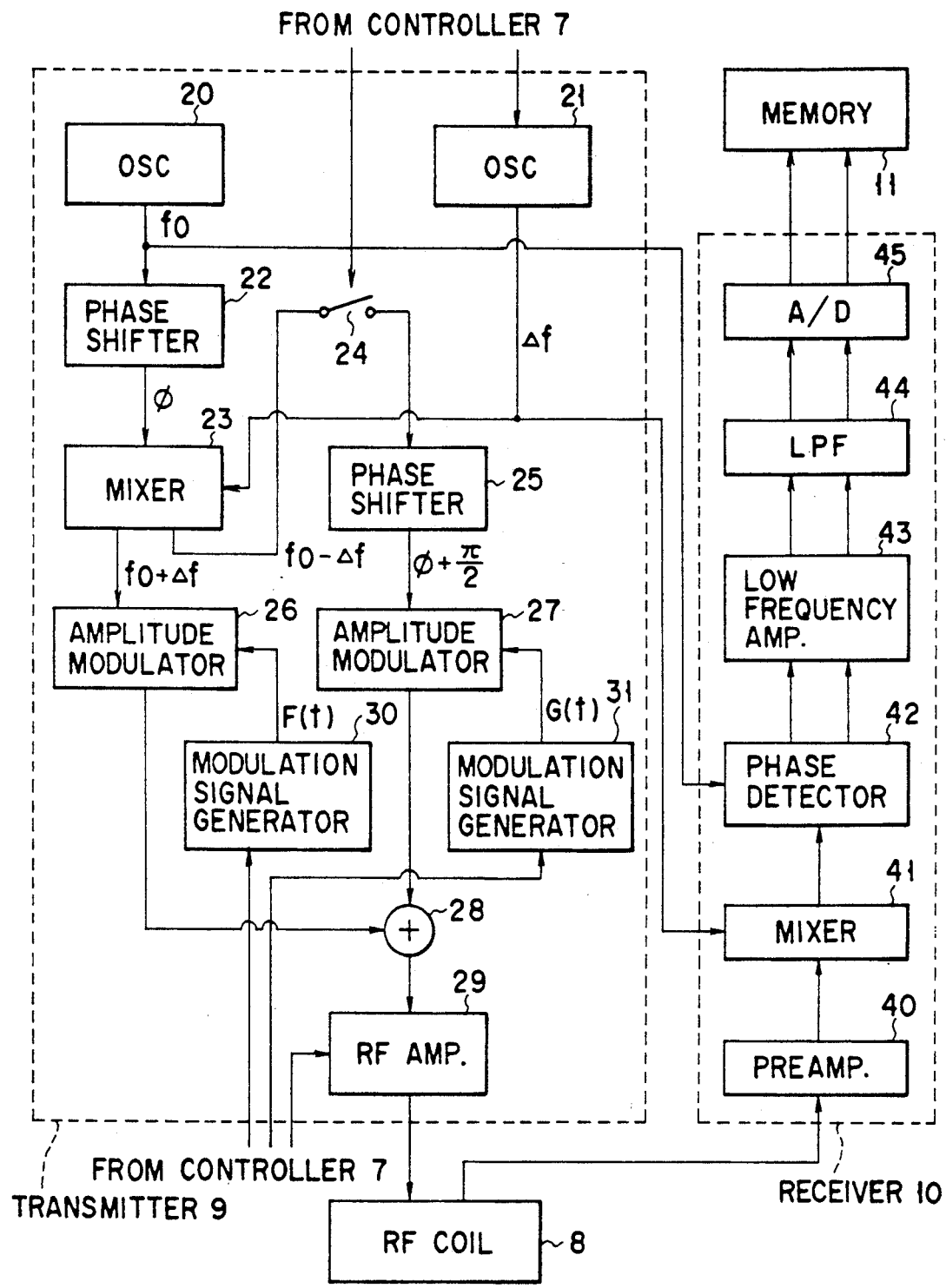
FIG. 3 is a block diagram showing in detail a transmitter and a receiver shown in FIG. 2.

FIG. 3 shows details of the transmitter 9 and the receiver 10. The transmitter 9 has an oscillator 20 with an oscillation frequency $f_0$ and an oscillator 21 with an oscillation frequency $\Delta f$. The oscillation frequency $f_0$ corresponds to a magnetic resonance frequency and is 64 MHz if a static field is 1.5 T. The output $f_0$ of the oscillator 20 is supplied to a mixer 23 after its phase is shifted by $\phi$ by a phase shifter 22. Generally, if the spin is repeatedly rotated to the same direction, an error of the gradient field is accumulated. Therefore, the rotation direction of a reference slice, in this case the slice A, is variously changed and is represented by this phase shift $\phi$. If this error accumulation is not considered, the phase shift $\phi$ becomes 0. The mixer 23 also receives the output $\Delta f$ from the oscillator 21. The mixer 23 outputs a signal indicating the sum of the individual outputs and a signal indicating the difference between them. One $(f_0 + \Delta f)$ of the two signals is supplied to a first input terminal of an adder 28 through an amplitude modulator 26. The other signal $(f_0 - \Delta f)$ is supplied to a second input terminal of the adder 28 through a switch 4, a 90° phase shifter 25, and an amplitude modulator 7. The switch 24 is turned on/off by a switch signal from the control device 7 to connect/disconnect a signal path between the mixer 23 and the 90° phase shifter 25. The 90° phase shifter 25 advances the phase of an input signal by 90° and outputs the signal. Hence, the phase of a signal supplied to the amplitude modulator 27 is $\phi + \pi/2$.

The amplitude modulators 26 and 27 are connected to modulation signal generators 30 and 31, respectively. The modulation signal generators 30 and 31 generate a modulation wave $F(t)$ of a sinc function $(\sin(x)/x)$ and a modulation wave $G(t)$ of a sinc function $(\cos(x)/x)$, having a phase shifted by 90° from that of the modulation wave $F(t)$, respectively, in correspondence with a predetermined slice thickness when a control signal from the control device 7 arrives. The modulation wave $F(t)$ is supplied to the amplitude modulator 26, and the modulation wave $G(t)$ to the amplitude modulator 27. In this case, the modulation waves $F(t)$ and $G(t)$ have different waveforms in order to manifest the phase difference between the outputs from the amplitude modulators 26 and 27.

The amplitude modulator 26 modulates the signal (phase $\phi$) with the frequency $f_0 + \Delta f$, as a carrier signal, by the modulation wave $F(t)$ and supplies the modulated signal to the second input terminal of the adder 28. The amplitude modulator 27 modulates the signal (phase $\phi+\pi/2$) with the frequency $f_0-\Delta f$, as a carrier signal, by the modulation wave G(t) and supplies the modulated signal to the first input terminal of the adder 28. The adder 28 superposes the two input signals (modulated signals) on each other.

The output from the adder 28 is supplied to the RF coil 8 through an RF power amplifier 29. Control signals from the control device 7 are supplied to the oscillator 21, the switch 24, the RF power amplifier 29, and the modulation signal generators 30 and 31. ON/OFF of the oscillator 21, the switch 24, and the RF power amplifier 29 and the generation timings of modulation signals are controlled by these control signals. Upon receiving a predetermined control signal from the control device 7, the oscillator 21 stops its output.

The receiver 10 includes a preamplifier 40 connected to the RF coil 8, and a mixer (intermediate frequency converter) 41, a phase detector 42, a low-frequency amplifier 43, a low-pass filter 44, and an A/D converter 45 connected in sequence to the output terminal of the preamplifier 40. An MR signal amplified by the preamplifier 40 is converted into an intermediate frequency by the mixer 41 by using a signal from the oscillator 21, and the converted signal is supplied to the phase detector 42. The phase detector 42 also receives, as a reference signal, the signal of the frequency $f_0$ from the oscillator 20, and therefore detects two MR signals which can be regarded as complex signals and shifted in phase by 90°. The two detected signals are supplied to the A/D converter 45 through the low-frequency amplifier 43 and the low-pass filter 44, each of which is of a two-channel type. The MR signals are converted into digital signals by this A/D converter 45 and the converted signals are stored in the memory device 11.

In this embodiment, the control device 7, the transmitter 9, and the RF coil 8 constitute a selective exciting means. On the other hand, together with the control device 7 and the RF coil 8, circuit components in the transmitter 9, except for the 90° phase shifter 25, the amplitude modulator 27, the adder 28, and the modulation signal generators 30 and 31, constitute the main part of a signal acquiring means. In addition, the receiver 10, the memory device 11, and the arithmetic operation device 12 constitute a signal processing means.

The operation of this embodiment will be described below with reference to FIGS. 4 to 7A and 7B.

When the pulse sequence is started and a timing for performing selective excitation is reached, the control device 7 supplies a control signal to the oscillator 21 of the transmitter 9 to cause it to generate the oscillation signal of $\Delta f$. At the same time, the control device 7 supplies a switch signal to the switch 24 to turn it on. Note that the oscillator 20 constantly operates to generate the oscillation signal of $f_0$ during the pulse sequence. The control device 7 also supplies control signals to the modulation signal generators 30 and 31 to cause them to generate the modulation signals F(t) and G(t), respectively.

Figure 4:
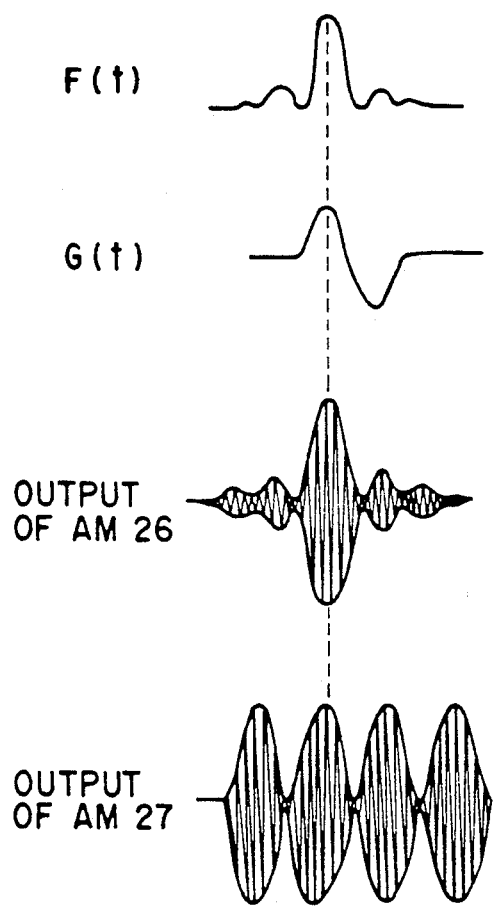
FIG. 4 is a view showing two amplitude modulation signals different in phase by 90°.

Hence, the output RF signal of the frequency $f_0$ from the oscillator 20 is shifted in phase by $\phi$ by the phase shifter 22, and the resultant signal is converted into two RF signals with the frequencies $f_0 \pm \Delta f$ and the phase $\phi$ by the mixer 23 on the basis of the signal of the frequency $\Delta f$ from the oscillator 21. The RF signal with the frequency $f_0+\Delta f$ and the phase $\phi$ is modulated in amplitude by the modulation signal F(t) for determining slice characteristics by the amplitude modulator 26, and the modulated signal is supplied to the adder 28. The RF signal with the frequency $f_0-\Delta f$ and the phase $\phi$ is supplied to the phase shifter 25 through the switch 24 and advanced only in phase by $\pi/2$ by the phase shifter 25. The output signal with the frequency $f_0-\Delta f$ and the phase $\phi+\pi/2$ from the shifter 25 is modulated in amplitude by the modulation wave G(t) different in phase by 90° from F(t) by the amplitude modulator 27, and the modulated signal is supplied to the adder 28. FIG. 4 shows the modulation wave signals F(t) and G(t) and the RF signals after the amplitude modulation. The adder 28 adds the two RF signals by superposition, and the sum signal is power-amplified by the RF power amplifier 29 and supplied to the RF coil 8. Consequently, an RF rotating field $H_1$ is applied to the patient P.

Figure 5A:
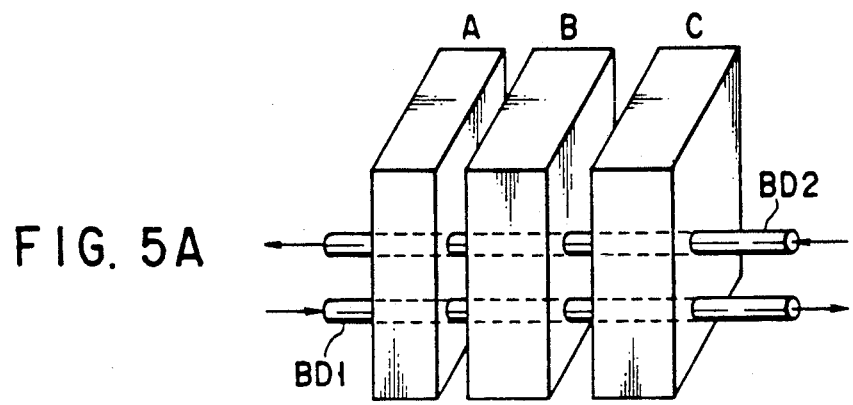
FIGS. 5A to 5C are views showing the principle of the first embodiment.

Consider the case wherein, as shown in FIG. 5A, two blood vessels BD1 and BD2 extend through three parallel slices A to C substantially perpendicularly to these slices. In this case, upon application of the rotating field $H_1$, side slices A and C deviated by $\pm \Delta f$ in the slice direction (z direction) with respect to a desired slice B to be imaged (a slice with a predetermined thickness corresponding to the center frequency $f_0$) of the patient P are excited simultaneously (see FIG. 6); that is, the slice A is a slice with a predetermined thickness corresponding to the center frequency $f_0+\Delta f$, and the slice C is a slice with a predetermined thickness corresponding to the center frequency $f_0-\Delta f$. In this excitation, a 90° pulse is used as an RF pulse in accordance with setting of the amplitude values of the modulation signals.

Figure 5B:
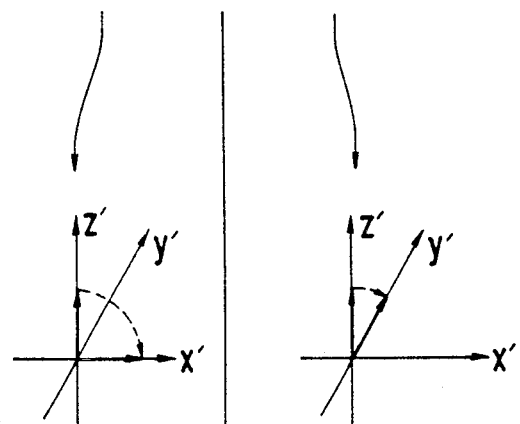

During the simultaneous excitation, RF pulses $f_0+\Delta f$ and $f_0-\Delta f$ with phase shifts for respectively rotating the spins to x' axis and to y' axis are applied. As a result, as shown in FIG. 5B, upon the simultaneous excitation described above, a nuclear spin in one side slice A is rotated by 90° from the z' axis to x' axis in a rotating coordinate system, and a nuclear spin in the other side slice C is rotated by 90° from the z' axis to the y' axis in the rotating coordinate system. In this case, the bloodstream BD1 in the slice A having the spin rotated by 90° to the x' axis keeps flowing into the slice B to be imaged from the left side in FIG. 5A. The bloodstream BD2 in the slice C having the spin rotated by 90° to the y' axis keeps flowing into the slice B to be imaged from the right side in FIG. 5A.

Figure 6:
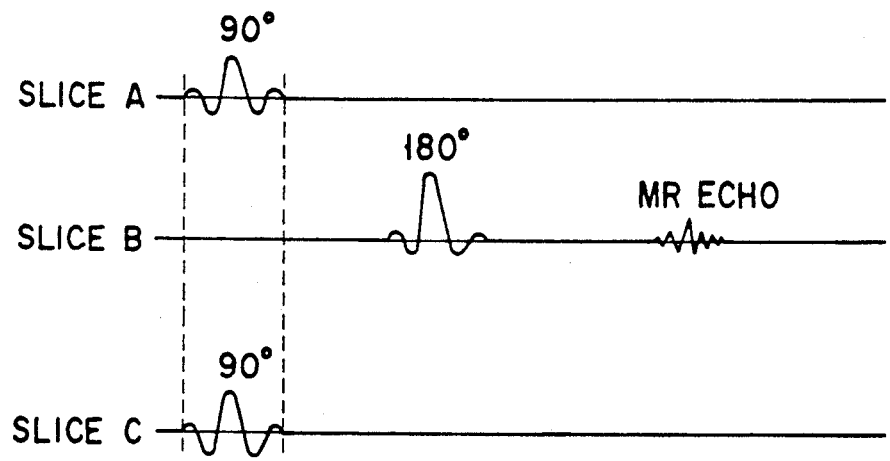
FIG. 6 shows a main part (of only RF pulses) of a pulse sequence of the first embodiment.

After a predetermined period of time lapsed from the simultaneous excitation, a signal acquisition timing is reached. At this time, the control device 7 stops oscillation of the oscillator 21 of the transmitter 9 and turns off the switch 24. Consequently, the transmitter 9 is set in a condition in which only the RF signal of the frequency $f_0$ is modulated by the modulation signal F(t). In addition, in this signal acquisition, the modulation signal generator 30 having received a command from the control device 7 increases the amplitude of the modulation signal F(t), and this in turn increases the power of an RF pulse to form a 180° pulse. That is, as shown in FIG. 6, at a predetermined signal acquisition timing, this 180° pulse is applied to excite only the slice B to be imaged with a predetermined thickness corresponding to the center frequency $f_0$.

Figure 5C:
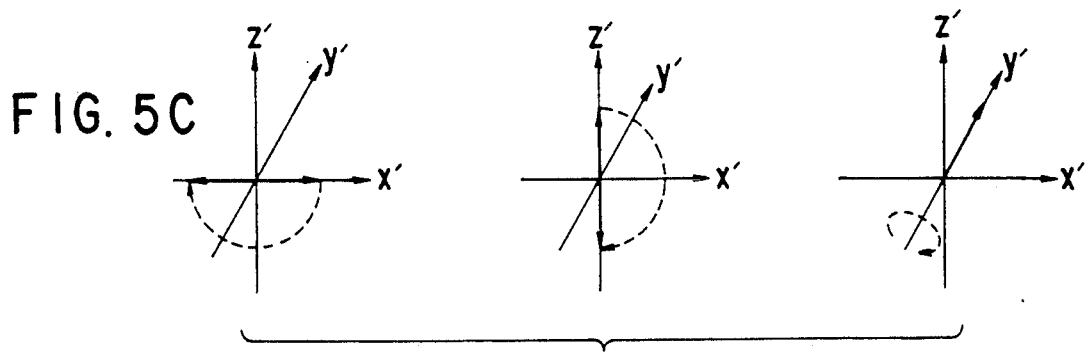

As shown in FIG. 5C, a spin in the slice B to be imaged excited by this 180° pulse is rotated by 180° about the y' axis. Therefore, as shown in FIG. 5C, the spin in the blood vessel BD1 flowing from the left slice A is rotated by 180° from the x' axis to the $-x'$ axis, and the spin in the blood vessel BD2 flowing from the right slice C is rotated by 180° but is kept along the y' axis. The spin in the stationary portion of the slice B, on the other hand, is rotated by 180° from the z' axis to the —z' axis in the rotating coordinate system.

For this reason, an MR signal associated with a spin echo is generated from the spin flowing from the slice A, which is rotated to the —x' axis, and an MR signal associated with a spin echo different in phase by 90° is generated from the spin flowing from the slice C, which is along the y' axis. However, no MR signal is generated by the stationary portion of the slice B in which the spin is rotated to the —z' axis. Note that in this explanation, a detailed description of a relaxation process is omitted.

When a predetermined time has lapsed after the 180° excitation, the control device 7 turns off the RF power amplifier 29 of the transmitter 9 to start signal acquisition. Therefore, the RF coil 8 detects MR signals from the slice B (see FIG. 6) and supplies the detected signals to the phase detector 42 through the preamplifier 40 and the mixer 41 of the receiver 10. The phase detector 42 performs phase detection corresponding to real and imaginary parts having a 90° phase difference between them. In this case, it is assumed that the x' axis and the y' axis respectively correspond to the real part and the imaginary part. Therefore, a signal of the real part (cos part) corresponds to image data of the bloodstream BD1 flowing from the side slice A on the left side of FIG. 5A, and a signal of the imaginary part (sin part) corresponds to image data of the bloodstream BD2 flowing from the side slice C on the right side of FIG. 5A. These two detected signals are separately stored as digital signals in the memory device 11 through the low-frequency amplifier 43, the low-pass filter 44, and the A/D converter 45. The two types of data of the real and imaginary parts stored in the memory device 11 are subjected to processing for imaging performed by the arithmetic operation device 12 and used in reconstruction of images. It may be assumed that the x' axis and the y' axis respectively correspond to the imaginary part and the real part. In this case, a signal of the real part corresponds to image data of the bloodstream BD2 flowing from the side slice B and a signal of the imaginary part corresponds to image data of the bloodstream BD1 flowing from the side slice A.

Figures 7A, 7B:
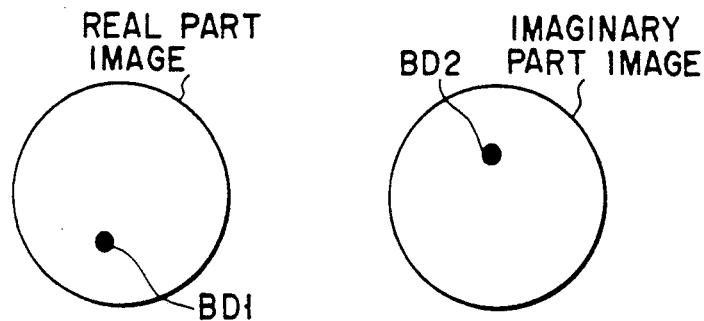
FIGS. 7A and 7B are views showing slice images obtained by the first embodiment.

The images obtained by this image reconstruction are represented, for example, as shown in FIGS. 7A and 7B. That is, the image shown in FIG. 7A formed by the real-part data represents only the bloodstream BD1 flowing from the side slice A into the slice B to be imaged. In contrast, the image shown in FIG. 7B formed by the imaginary-part data represents only the bloodstream BD2 flowing from the side slice C on the opposite side into the slice B to be imaged. The stationary portion does not appear in the images shown in FIGS. 7A and 7B. For this reason, a blood vessel of either an artery or a vein appears in only one of the images formed by the real-part data and the imaginary-part data in accordance with which flip angle of spin in the slide slices A and C upon simultaneous excitation is set to the x' (or y') axis. Therefore, by monitoring which of an artery and a vein appears in which image, the directions of bloodstreams can be easily discriminated. This can be used in discrimination of blood vessels in, e.g., a neck portion in which an artery and a vein run substantially parallel to each other.

As described above, the discrimination of bloodstream directions according to this embodiment is based on the simultaneous excitation of two side slices and the single signal acquisition processing. Hence, it is possible to provide MR angiography in which the imaging time is largely shortened and the throughput of patient is improved as compared with a conventional pre-saturation method in which excitation and signal acquisition are separately performed for two individual slices. In addition, since the imaging time is shortened, an artifact caused when an object to be examined moves can be reduced. This enables imaging with an improved accuracy.

Figure 8:
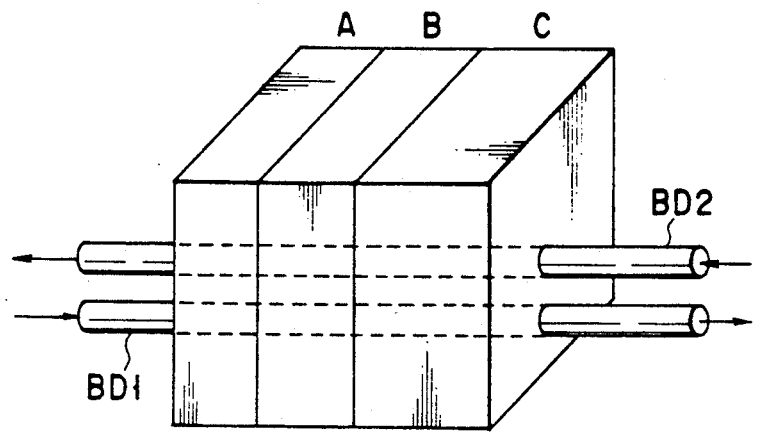
FIG. 8 is a view showing a first modification of the arrangement of three slices.

Note that position setting of a slice to be imaged and its side slices is not limited to that of the above embodiment but may take various modifications. For example, as shown in FIG. 8, the side slices A and C may be set close to, i.e., adjacent to the slice B to be imaged for signal acquisition. In this case, the slices A and C are called adjacent slices.

Figure 9:
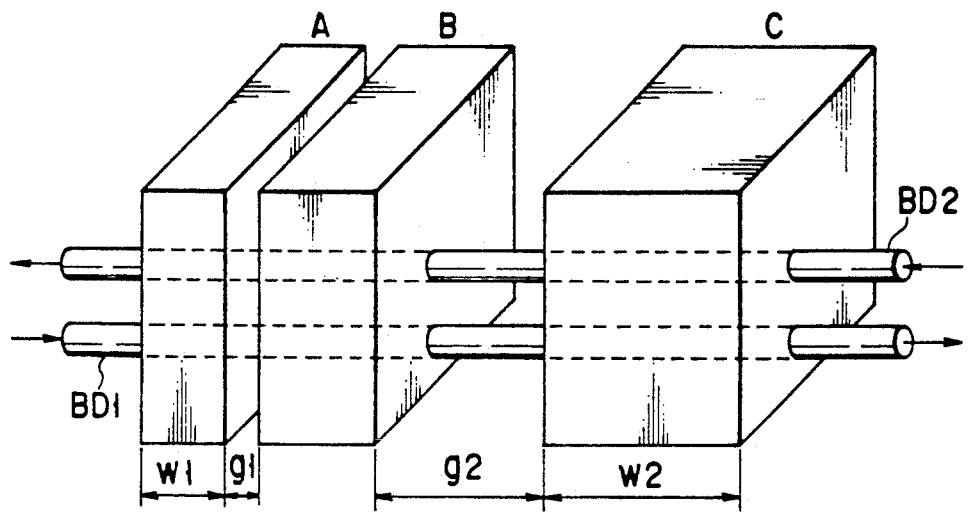
FIG. 9 is a view showing a second modification of the arrangement of three slices.

In slice setting shown in FIG. 9, one side slice A is positioned with a slight gap $g_1$ with respect to the slice B to be imaged, the other side slice C is positioned with a gap $g_2$ wider than $g_1$ with respect to the slice B, and the excitation thicknesses of the slices A and C are set different from each other ($W_1$ for the slice A and $W_2$ ($>W_1$) for the slice C). This makes it possible to perform selective excitation in accordance with the difference in velocity between fluids in two directions flowing into the slice B to be imaged. That is, if the two side slices are located with the same gap, a spin which is flipped 90° to the x' or y' axis beforehand may pass through a region to be imaged during imaging because the bloodstream in an artery is faster than that in a vein, with the result that no blood vessel appears in an image. For this reason, the arrangement as shown in FIG. 9 is set such that the direction of the bloodstream BD2 coincides with the direction of an artery, thereby ensuring imaging.

The center of the slice is determined by the frequency of the RF pulse. The thickness of the slice is determined by the bandwidth of the RF pulse. Thus, the thickness and the gap are controlled based on the frequency and the bandwidth of the RF pulse.

Figure 10:
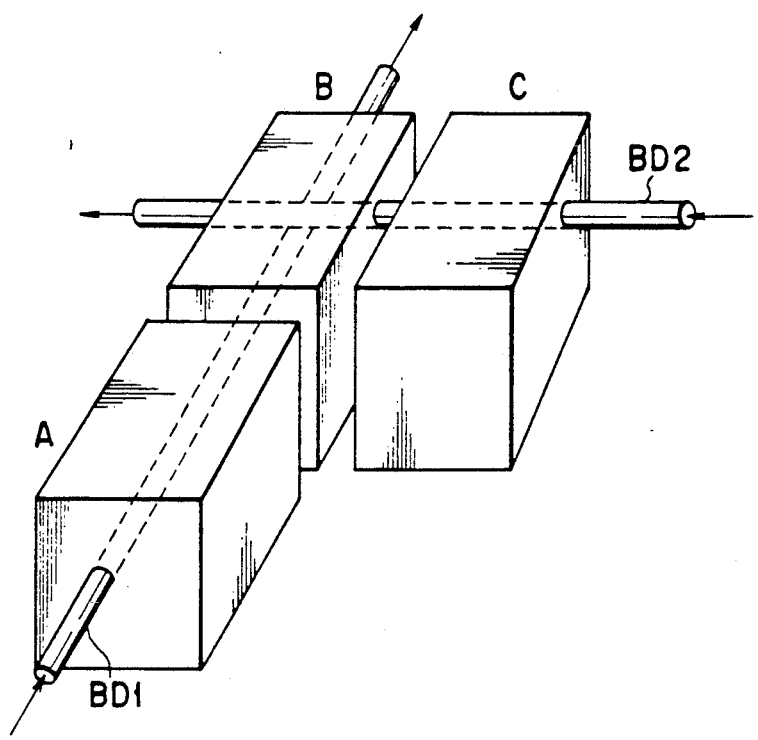
FIG. 10 is a view showing a third modification of the arrangement of three slices.

In slice setting shown in FIG. 10, the side slices A and C are positioned beside the slide B to be imaged such that their normal lines perpendicular to the slice direction are set perpendicular to each other. This positioning can meet the condition in which the bloodstreams BD1 and BD2 cross substantially perpendicular to each other. It is also possible to set the normal lines of the side slices A and C to cross each other obliquely by modifying the slice positioning shown in FIG. 10. In this case, the directions of a plurality of fluids flowing obliquely across each other can be discriminated. The pulse sequence for realizing the position of the slices A and C is shown in FIG. 11. After the slice A is excited by a 90° pulse with a phase $\phi$, the slice C is excited by a 90° pulse with a phase $\phi + \pi/2$. It is desirable to shorten the interval between the two 90° pulses. When the slice B is excited by a 180° pulse, the MR echoes from the slice C and slice A are sequentially acquired.

As has been described above, in the magnetic resonance imaging apparatus and the magnetic resonance imaging method according to the present invention, nuclear spins in two side regions from which fluids flow into a region to be imaged, are selectively excited by two different phases in a rotating coordinate system, and the polarity of the nuclear spin in the region to be imaged is inverted to generate MR signals. The generated MR signals are detected for each of the two different phases, and two MR images are respectively formed from the two detected signals. Therefore, two images can be formed by the single signal acquisition processing to allow discrimination of the flow directions of the fluids. This is useful in, e.g., determining an artery and a vein. In the present invention, the examination time is shortened and the throughput of patients is improved compared to the conventional pre-saturation method in which signal acquisition is executed twice. In addition, since the probability that a patient or a portion to be examined moves during imaging is decreased, the examination accuracy is significantly improved.

Additional advantages and modifications w readily occur to those skilled in the art. Therefore, the present invention in its broader aspects i not limited to the specific details, representative devices, and illustrated examples shown and described herein. Accordingly, various modifications may be made without departing from the spirit or scope of the general inventive concept as defined by the appended claims and their equivalents. For example, the selective exciting means is not limited to that of the above embodiment, which performs selective excitations of the side slices A and C simultaneously. That is, the selective excitations of the slices A and C ma be performed at different timings in accordance with the difference in velocity between the bloodstreams BD1 and BD2. This increases the degree of freedom in selecting a slice setting method.

The arrangement of this selective exciting method is also not limited to that in which the oscillator 21 for shifting slice positions is provided independently of the oscillator 20 for RF pulses. For example, two oscillators 52 and 54 having two oscillation frequencies f1 and f2 may be provided to selectively excite two slices in arbitrary positions. as shown in FIG. 12. In this modification, the outputs of the oscillators 52 and 54 are supplied to phase shifters 56 and 58 and phase-shifted by $\phi$ and $\phi + \pi/2$, respectively. The outputs of the phase shifters 56 and 58 are supplied to the mixer 28 through the amplitude modulators 26 and 27.

Furthermore, the above embodiment is described by taking a case wherein the phase angles of the side slices A and C upon excitation are different from each other by 90° as an example. However, the difference between the phase angles need not be 90° provided that the reference phase angle upon detection is coincide with the phase angle upon excitation.

The number of side slices, on the other hand, is not limited to two as in the above embodiment but may be three or more (in the case of three, two on one side and one on the other side) where necessary.

The flip angle of a spin associated with the selective excitation of the present invention also need not be 90° but can be an angle smaller than 90°.

In addition, fluids of an object to be examined, discrimination between the directions of which is performed by the present invention, are not limited to bloodstreams but may be, for example, cerebrospinal fluids.

What is claimed is:

1. A magnetic resonance imaging apparatus comprising:
    selective exciting means for selectively exciting at least two side regions, which are located in the vicinity of a region to be imaged including fluids in an object to be examined, and which also include the fluids, with two phases in a rotating coordinate system by using a radio-frequency (RF) pulse;
    signal acquiring means for acquiring magnetic resonance (MR) signals from the region to be imaged after the selective excitation performed by said selective exciting means; and
    phase detecting means for detecting phases of the acquired MR signals for each of said two phases.

2. An apparatus according to claim 1, wherein
    said side regions are two regions parallel to the region to be imaged, and
    said selective exciting means excites one side region in the x direction of the rotating coordinate system and the other side region in the y direction of the rotating coordinate system at the same time.

3. An apparatus according to claim 1, wherein
    said side regions are two regions adjacent to the region to be imaged, and
    said selective exciting means excites one side region in the x direction of the rotating coordinate system and the other side region in the y direction of the rotating coordinate system at the same time.

4. An apparatus according to claim 1, wherein said RF pulse is a 90° pulse.

5. An apparatus according to claim 1, wherein said signal acquiring means inverts the polarity of a nuclear spin in the region to be imaged by using a 180° pulse and then acquires MR signals from the region to be imaged.

6. A magnetic resonance imaging method comprising the steps of:
    selectively exciting at least two side regions, which are located in the vicinity of a region to be imaged including fluids in an object to be examined, and which also include the fluids, with two different phases in a rotating coordinate system by using a radio-frequency (RF) pulse;
    acquiring magnetic resonance (MR) signals from the region to be imaged after the selective excitation;
    detecting phases of the acquired MR signals for each of the two phases; and
    forming images of flows of the fluids on the basis of the phase-detected signals.

7. A magnetic resonance imaging method comprising the steps of:
    selectively exciting a nuclear spin in a first region through which a fluid flows;
    inverting a polarity of a nuclear spin in a second region through which the fluid having passed through said first region flows, thereby generating a magnetic resonance (MR) signal;
    acquiring the generated MR signal; and
    reconstructing an MR image from the acquired MR signal.

8. A magnetic resonance imaging method comprising the steps of:
    exciting a nuclear spin in a first side region having a first fluid flowing into a region to be imaged along a first direction and a nuclear spin in a second side region having a second fluid flowing into the region to be imaged along a second direction, with two phases;
    inverting a nuclear spin in the region to be imaged;
    acquiring magnetic resonance (MR) signals generated from the region to be imaged; and
    detecting the acquired MR signals for each of the two phases to reconstruct two images.

9. A method according to claim 8, wherein the nuclear spins in the first and second side regions are excited by two phases different from each other by 90° in a rotating coordinate system.

10. A method according to claim 9, wherein the nuclear spins in the first and second side regions are excited in x'- axis and y'-axis directions, respectively, in the rotating coordinate system.

11. A method according to claim 8, wherein the first and second side regions are parallel to the region to be imaged, are separated by equal gaps from the region to be imaged, and have equal slice thicknesses.

12. A method according to claim 8, wherein the first and second side regions are parallel to the region to be imaged, are separated by first and second gaps, respectively, from the region to be imaged, and have first and second slice thicknesses, respectively.

13. A method according to claim 8, wherein the first and second side regions are parallel to the region to be imaged, are in contact with the region to be imaged, and have equal slice thicknesses.

14. A method according to claim 8, wherein the first and second side regions are so selected as to contain said first and second fluids crossing each other.

15. A magnetic resonance imaging apparatus comprising:

a first oscillator with a first frequency corresponding to a region to be imaged;

a second oscillator for generating a signal of a second frequency, which is lower than the first frequency, for shifting the frequency of said first oscillator;

means for mixing outputs from said first and second oscillators to form a sum signal of the first frequency plus the second frequency and a difference signal of the first frequency minus the second frequency;

means for shifting phases of the sum signal and the difference signal to be different from each other by 90° and applying the consequent sum and different signals to a radio-frequency (RF) coil to generate an RF pulse, thereby exciting two side regions on both sides of the region to be imaged by different phases;

means for amplifying the output from said first oscillator and applying the amplified output to said RF coil to generate a 180° pulse to invert a spin in the region to be imaged, thereby generating magnetic resonance (MR) signals from the region to be imaged; and means for performing quadrature detection for the MR signals received by said RF coil to form a real-part image and an imaginary-part image.

* * * * *